US008847324B2

(12) United States Patent
Choi et al.

(10) Patent No.: US 8,847,324 B2
(45) Date of Patent: Sep. 30, 2014

(54) INCREASING ION /IOFF RATIO IN FINFETS AND NANO-WIRES

(71) Applicant: Synopsys, Inc., Mountain View, CA (US)

(72) Inventors: Munkang Choi, Pleasanton, CA (US); Victor Moroz, Saratoga, CA (US); Xi-Wei Lin, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/717,532

(22) Filed: Dec. 17, 2012

(65) Prior Publication Data
US 2014/0167174 A1    Jun. 19, 2014

(51) Int. Cl.
 H01L 29/78    (2006.01)
 H01L 21/02    (2006.01)
(52) U.S. Cl.
 CPC .......... H01L 29/78 (2013.01); H01L 21/02365 (2013.01)
 USPC .......................................... 257/368; 257/192
(58) Field of Classification Search
 CPC ... H01L 29/6659; H01L 29/78; H01L 27/105; H01L 27/10; H01L 21/336; H01L 29/88; H01L 31/0328; H01L 29/739; H01L 29/788; H01L 31/072
 USPC .................................. 257/288, 192, 368, 369
 See application file for complete search history.

(56) References Cited

U.S. PATENT DOCUMENTS

| 5,600,578 A | 2/1997 | Fang et al. |
| 5,606,518 A | 2/1997 | Fang et al. |
| 6,420,231 B1 | 7/2002 | Harari et al. |
| 6,593,176 B2 | 7/2003 | Dennison |
| 6,599,781 B1 | 7/2003 | Li |
| 6,706,571 B1 | 3/2004 | Yu et al. |
| 6,812,508 B2 | 11/2004 | Fukumi |
| 6,831,292 B2 | 12/2004 | Currie et al. |
| 6,881,632 B2 | 4/2005 | Fitzgerald et al. |
| 7,190,050 B2 | 3/2007 | King et al. |

(Continued)

FOREIGN PATENT DOCUMENTS

JP   11-289089    10/1999
KR   10-1031798 B1    4/2011

OTHER PUBLICATIONS

PCT/US2013/075814—International Search Report and Written Opinioin dated Apr. 23, 2014, 15 pages.

(Continued)

*Primary Examiner* — Whitney T Moore
(74) *Attorney, Agent, or Firm* — Haynes Beffel & Wolfeld LLP; Warren S. Wolfeld

(57) ABSTRACT

Roughly described, an integrated circuit transistor structure has a body of semiconductor material, the body having two longitudinally spaced doped source/drain volumes with a channel between, a gate stack disposed outside the body and facing at least one of the surfaces of the body along the channel. The body contains an adjustment volume, longitudinally within the channel volume and spaced behind the first surface by a first distance and spaced longitudinally from both the source/drain volumes. The adjustment volume comprises an adjustment volume material having, at each longitudinal position, an electrical conductivity which differs from that of the adjacent body material at the same longitudinal position, at least while the transistor is in an off-state. In one embodiment the adjustment volume material is a dielectric. In another embodiment the adjustment volume material is an electrical conductor.

25 Claims, 11 Drawing Sheets
(3 of 11 Drawing Sheet(s) Filed in Color)

(56) References Cited

U.S. PATENT DOCUMENTS

| | | | |
|---|---|---|---|
| 7,224,019 B2 | 5/2007 | Hieda et al. |
| 7,266,787 B2 | 9/2007 | Hughes et al. |
| 7,291,519 B2 | 11/2007 | Bhattacharyya |
| 7,307,273 B2 | 12/2007 | Currie |
| 7,337,420 B2 | 2/2008 | Chidambarrao et al. |
| 7,358,142 B2 | 4/2008 | Kang et al. |
| 7,437,260 B2 | 10/2008 | Ausserlechner et al. |
| 7,440,861 B2 | 10/2008 | Ausserlechner et al. |
| 7,484,198 B2 | 1/2009 | Lin et al. |
| 7,504,678 B2 | 3/2009 | Chau et al. |
| 7,528,465 B2 | 5/2009 | King et al. |
| 7,542,891 B2 | 6/2009 | Lin et al. |
| 7,714,397 B2 | 5/2010 | Hareland et al. |
| 7,921,401 B2 | 4/2011 | Ito et al. |
| 7,960,232 B2 | 6/2011 | King et al. |
| 8,086,990 B2 | 12/2011 | Lin et al. |
| 8,222,680 B2 | 7/2012 | Lin et al. |
| 8,604,518 B2 | 12/2013 | Bhuwalka et al. |
| 2003/0173588 A1 | 9/2003 | Bianchi |
| 2004/0044511 A1 | 3/2004 | Sekido et al. |
| 2004/0059559 A1 | 3/2004 | Shimizu et al. |
| 2004/0075122 A1 | 4/2004 | Lin et al. |
| 2004/0075149 A1 | 4/2004 | Fitzgerald et al. |
| 2004/0099925 A1 | 5/2004 | Poveda |
| 2004/0108559 A1 | 6/2004 | Sugii et al. |
| 2004/0153986 A1 | 8/2004 | Sahara et al. |
| 2004/0217448 A1 | 11/2004 | Kumagai et al. |
| 2005/0017304 A1 | 1/2005 | Matsushita et al. |
| 2005/0023569 A1 | 2/2005 | Yang |
| 2005/0040460 A1 | 2/2005 | Chidambarrao et al. |
| 2005/0056892 A1 | 3/2005 | Seliskar |
| 2005/0073005 A1 | 4/2005 | Nowak et al. |
| 2005/0077511 A1 | 4/2005 | Fitzergald |
| 2005/0093059 A1 | 5/2005 | Belyansky et al. |
| 2005/0104057 A1 | 5/2005 | Shaheed et al. |
| 2005/0110039 A1 | 5/2005 | Chi et al. |
| 2005/0112822 A1 | 5/2005 | Litwin |
| 2005/0121727 A1 | 6/2005 | Ishitsuka et al. |
| 2005/0139929 A1 | 6/2005 | Rost |
| 2005/0158931 A1 | 7/2005 | Chen et al. |
| 2005/0176204 A1 | 8/2005 | Langdo et al. |
| 2005/0184345 A1 | 8/2005 | Lin et al. |
| 2005/0202604 A1 | 9/2005 | Cheng et al. |
| 2005/0224800 A1 | 10/2005 | Lindert et al. |
| 2005/0224875 A1 | 10/2005 | Anderson et al. |
| 2005/0224890 A1 | 10/2005 | Bernstein et al. |
| 2005/0239254 A1 | 10/2005 | Chi et al. |
| 2005/0247926 A1 | 11/2005 | Sun et al. |
| 2005/0280121 A1 | 12/2005 | Doris et al. |
| 2005/0285186 A1 | 12/2005 | Fujiwara |
| 2006/0003510 A1 | 1/2006 | Kammler et al. |
| 2006/0019458 A1 | 1/2006 | Chidambarrao et al. |
| 2006/0043529 A1 | 3/2006 | Chidambarrao et al. |
| 2006/0091475 A1 | 5/2006 | Fujii et al. |
| 2006/0113603 A1 | 6/2006 | Currie |
| 2006/0142987 A1 | 6/2006 | Ishizu et al. |
| 2006/0157687 A1 | 7/2006 | Doyle et al. |
| 2006/0186478 A1 | 8/2006 | Hughes et al. |
| 2006/0190893 A1 | 8/2006 | Morton |
| 2006/0228863 A1 | 10/2006 | Zhang et al. |
| 2006/0240650 A1 | 10/2006 | Orlowski et al. |
| 2006/0267130 A1 | 11/2006 | Rao |
| 2007/0026599 A1 | 2/2007 | Peidous et al. |
| 2007/0028195 A1 | 2/2007 | Chidambarrao et al. |
| 2007/0096170 A1 | 5/2007 | Chidambarrao et al. |
| 2007/0096206 A1 | 5/2007 | Chidambarrao |
| 2007/0108531 A1 | 5/2007 | Chidambarrao |
| 2007/0235763 A1 | 10/2007 | Doyle et al. |
| 2007/0292996 A1 | 12/2007 | Abadeer et al. |
| 2008/0127005 A1 | 5/2008 | Lin et al. |
| 2008/0195983 A1 | 8/2008 | Chidambarrao et al. |
| 2009/0057777 A1 | 3/2009 | Fujii et al. |
| 2009/0095987 A1 | 4/2009 | Rost |
| 2009/0217217 A1 | 8/2009 | Lin et al. |
| 2011/0163369 A1 | 7/2011 | Xiao et al. |
| 2013/0102116 A1 | 4/2013 | Xiao et al. |
| 2013/0134522 A1 | 5/2013 | Bhuwalka |

OTHER PUBLICATIONS

Radosavljevic, M., et al., "Electrostatics Improvement in 3-D Tri-gate Over Ultra-Thin Body Planar InGaAs Quantum Well Field EffectTransistors with High-K Gate Dielectric and Scaled Gate-to-Drain/Gate-to-Source Separation," 2011 IEEE International Electron Devices Meeting (IEDM), #278, 3 pgs.

Radosavljevic, M., et al., "Non-Planar, Multi-Gate InGaAs Quantum Well Field Effect Transistors with High-K Gate Dielectric and Ultra-Scaled Gate-to-Drain/Gate-to-Source Separation for Low Power Logic Applications," 2010 IEEE International ElectronDevices Meeting (IEDM), pp. 126-129.

Choi et al., "A spacer patterning technology for nanoscale CMOS," IEEE Transactions on Electron Devices, vol. 49, No. 3, pp. 436-441, Mar. 2002.

Hisamoto D., et al., "A Folded-channel MOSFET for Deep sub-tenth Micron Era", IEEE International Electron Device Meeting Technical Digest, Dec. 6-9, 1998, pp. 1032-1034.

Lindert N. et al., "Sub-60-nm Quasi-Planar FinFETs Fabricated Using a Simplified Process," IEEE Electron Device Letters, 22, Oct. 2001, pp. 487-489.

R.A. Bianchi et al., "Accurate Modeling of Trench Isolation Induced Mechanical Stress Effects on MOSFET Electrical Performance," IEEE IEDM Tech. Digest, pp. 117-120 (Dec. 2002).

Xuemei (Jane) XI, et al., "BSIM4.3.0 Model, Enhancements and Improvements Relative to BSIM4.2.1", University of California at Berkeley (2003) available at http://www-devices.eecs.berkeley.edu/~bsim3/BSIM4/BSIM430/doc/BSIM430_Enhancement.pdf.

F. Nouri et al., "A Systematic Study of Trade-offs in Engineering a Locally Strained pMOSFET", Proc. IEDM, pp. 1055-1058, 2004.

S.E. Thompson et al., "A 90-nm Logic Technology Featuring Strained-Silicon", IEEE Transactions on Electron Devices, 2004.

G. Eneman et al, "Layout Impact on the Performance of a Locally Strained PMOSFET", 2005 Symposium on VLSI Technology Digest of Technical Papers, pp. 22-23, 2005.

V. Moroz et al., "Analyzing strained-silicon options for stress-engineering transistors", Solid State Technology, Jul. 2004.

Y. Kanda, "A Graphical Representation of the Piezoresistance Coefficients in Silicon", IEEE Transactions on Electron Devices, vol. Ed-29, No. 1, Jan. 1982.

C.S. Smith, "Piezoresistance Effect in Germanium and Silicon", Physical Review, vol. 94, No. 1, Apr. 1, 1954.

Smith, et al., "Exploring the Limits of Stress-Enhanced Hole Mobility", IEEE Electron Device Letters, vol. 26, No. 9, Sep. 2005.

Moroz, et al., "Options at the 45 nm node include engineered substrates", Solid State Technology, Jul. 2005.

Gildenblat, G., et al., "PSP Model" Department of Electrical Engineering, The Pennsylvania State University and Philips Research, (Aug. 2005) 82 pages.

Quirk et al. Semiconductor Manufacturing Technology, 2001, Prentice Hall, 67 pages.

Brigham Young University, Crystal Planes in Semiconductors, 2010, http://cleanroom.byu.edu/EW.sub.--orientation.phtml, pp. 1-2.

OFF-STATE CURRENT

OFF-STATE LEAKAGE CURRENT

OFF-STATE ELECTROSTATIC POTENTIAL

OFF-STATE LEAKAGE
CURRENT

OFF-STATE ELECTROSTATIC
POTENTIAL

OFF-STATE LEAKAGE CURRENT

OFF-STATE ELECTROSTATIC POTENTIAL

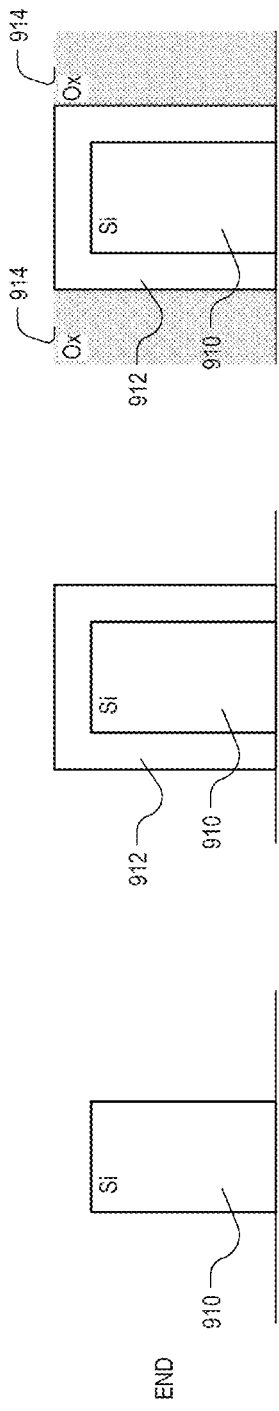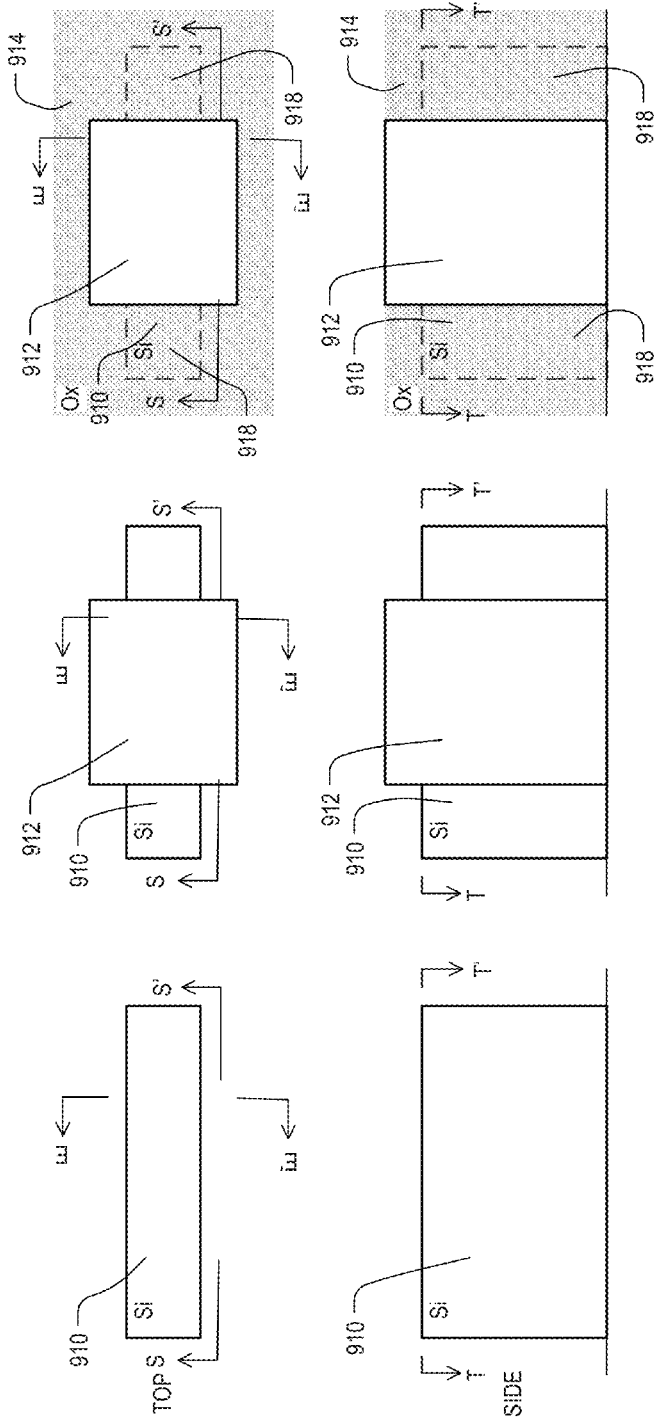
FIG. 9A    FIG. 9B    FIG. 9C

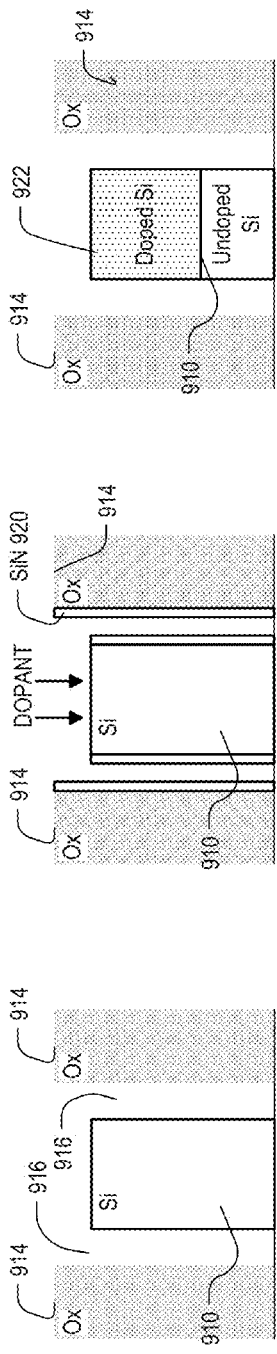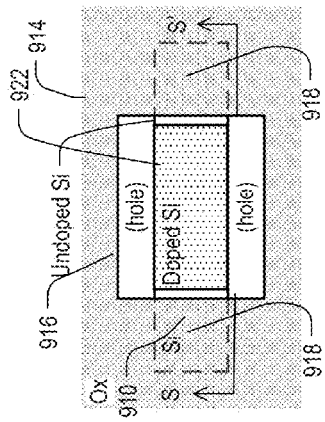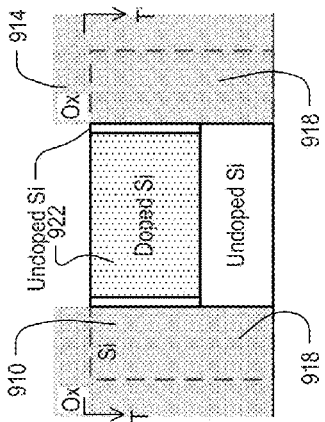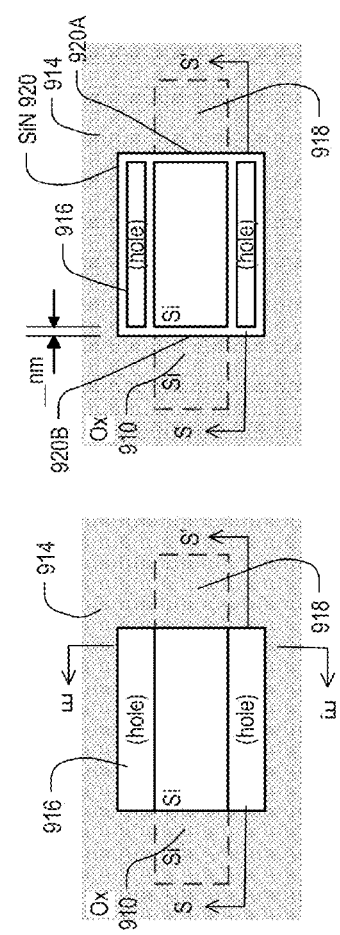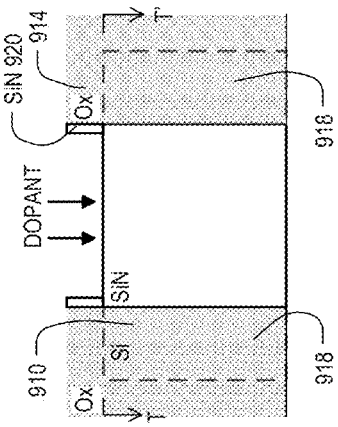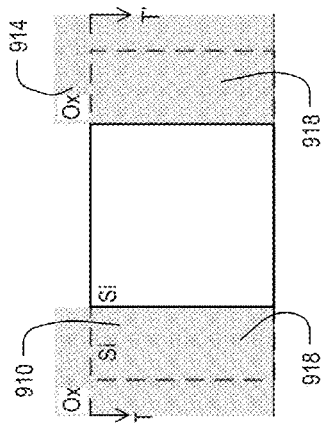
FIG. 9D    FIG. 9E    FIG. 9F

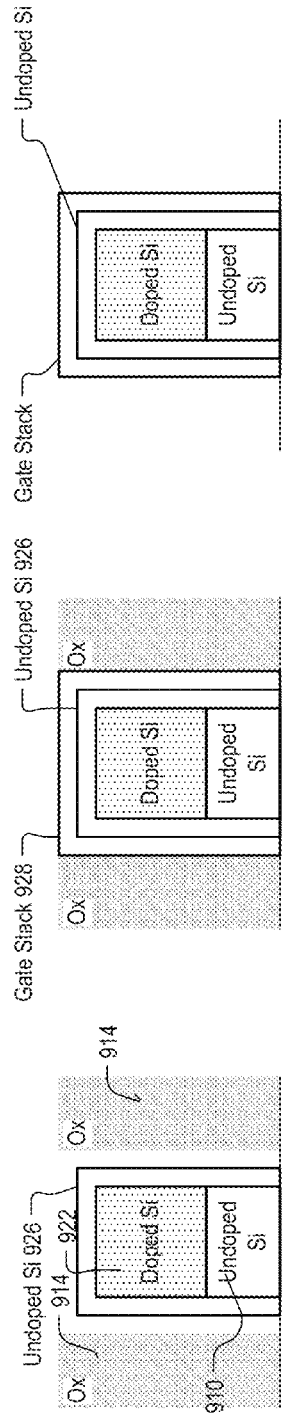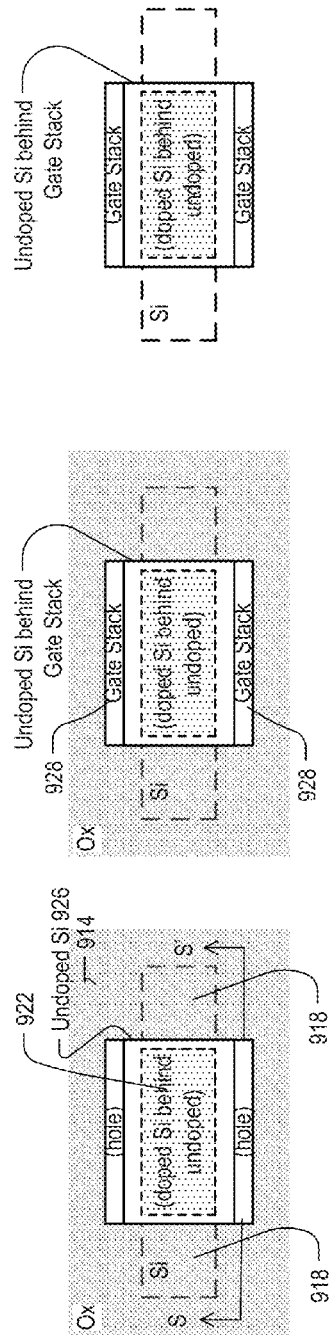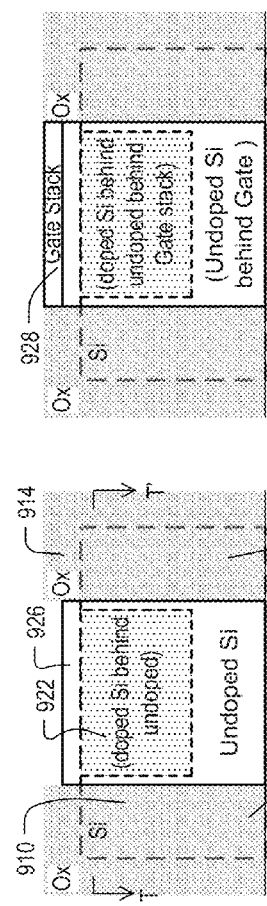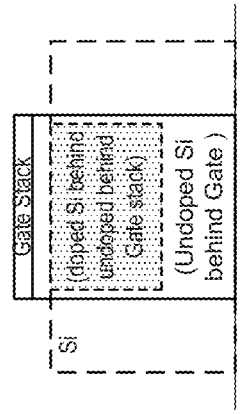
FIG. 9G   FIG. 9H   FIG. 9I

INCREASING ION /IOFF RATIO IN FINFETS AND NANO-WIRES

BACKGROUND

The invention relates to semiconductor fabrication, and more particularly to a technique for increasing Ion/Ioff ratios in FinFETs, nano-wires, and other similar structures.

As integrated circuit technologies continue to push into higher densities, a number of transistor types have become popular which involve one or more narrow channel structures wrapped with a gate electrode. The channel structures are often called fins, and transistors that include them are sometimes called FinFETs, described for example in D. Hisamoto et al., IEDM, 1998; and N. Lindert et al., IEEE Electron Device Letters, p. 487, 2001, both incorporated by reference herein for their teachings. The fins comprise semiconductor bodies usually arranged in parallel on the substrate, so that they project vertically upwards from the substrate. A gate dielectric layer overlies the sides and top of the fins, and a gate conductor, which can be implemented using metal or poly-silicon for example, extends across the fins and over the gate dielectric layer. On either side of the gate conductor, source and drain regions are implemented in the fins. The FET transistors that result have source, channel and drain regions in the fins, and a gate overlying the fins. Such transistors are often called multi-gate transistors, because the gate conductor wraps around three sides of the fins, and as a result increases the effective width of the channel. In a future proposed structure the gate wraps entirely around the channel structure, in which case the multi-gate transistor is sometimes called a nano-wire. As used herein, however, nano-wires are considered a special case of FinFETs and the channel structures are still sometimes referred to herein as fins.

The fins used to implement the FinFET transistors can be quite narrow. As a result of the multi-gate gate structure and the narrow widths of the fins, FinFET transistors have excellent performance characteristics and small layout areas. But even with such narrow fins, the electric field generated by the gate control voltage when the device is in its off state can be limited in depth and may not extend sufficiently into the cross-sectional middle of the fin. This causes leakage through the middle of the fin. The wider the fin, the higher the leakage because the middle is too far from the gate to be under gate voltage control. Thus the Ion/Ioff ratio suffers. Manufacturers can reduce this problem by narrowing the fin further, but this solution is difficult to implement because the mechanical instability and line edge roughness of such a narrow fin can cause yield loss.

Accordingly, there is a need for better ways to improve the Ion/Ioff ratio in multi-gate transistors.

SUMMARY

An opportunity therefore arises to create robust solutions to the problem of reduced Ion/Ioff ration in multi-gate transistors. Better chip yields, and denser, and more powerful circuits, components and systems may result.

Roughly described, the invention involves an integrated circuit transistor structure having a body of semiconductor material, the body having two longitudinally spaced doped source/drain volumes with a channel between, a gate stack disposed outside the body and facing at least one of the surfaces of the body along the channel. The body contains an "adjustment volume", which is a volume disposed longitudinally within the channel volume, spaced behind the first surface by a first distance, and spaced longitudinally from both the source/drain volumes. In a FinFET embodiment, the adjustment volume may be disposed entirely within the fin. The adjustment volume comprises an adjustment volume material having, at each longitudinal position, an electrical conductivity which differs from that of the adjacent body material at the same longitudinal position, at least while the transistor is in an off-state. In one embodiment the adjustment volume material is a dielectric. In another embodiment the adjustment volume material is an electrical conductor.

The above summary of the invention is provided in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description that is presented later. Particular aspects of the invention are described in the claims, specification and drawings.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The invention will be described with respect to specific embodiments thereof, and reference will be made to the drawings, in which:

FIG. 2A is a cross-sectional view of the channel volume of the transistor of FIG. 1.

FIG. 2B is a top view of the transistor of FIG. 1, taken from a horizontal 2D slice through the middle of the fin height, and colored to show off-state leakage current densities.

FIG. 2C is a top view of the transistor of FIG. 1, taken from a horizontal 2D slice through the middle of the fin height, and colored to show off-state electrostatic potentials.

FIGS. 9A-9I (collectively FIG. 9) illustrate a sequence of steps by which an adjustment volume material can be formed inside a fin as illustrated in FIG. 3.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1C:
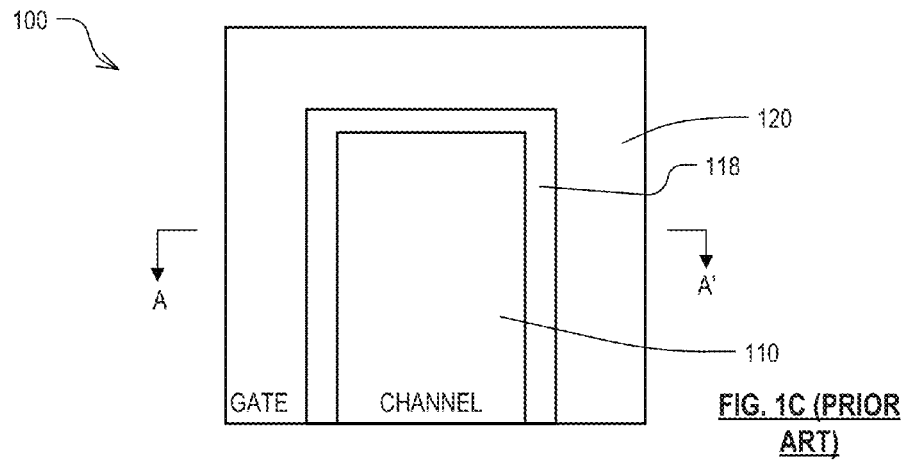
FIGS. 1D, 1C, 1A and 1B (collectively FIG. 1) illustrate a simplified prior art FinFET transistor.
Figure 1A:
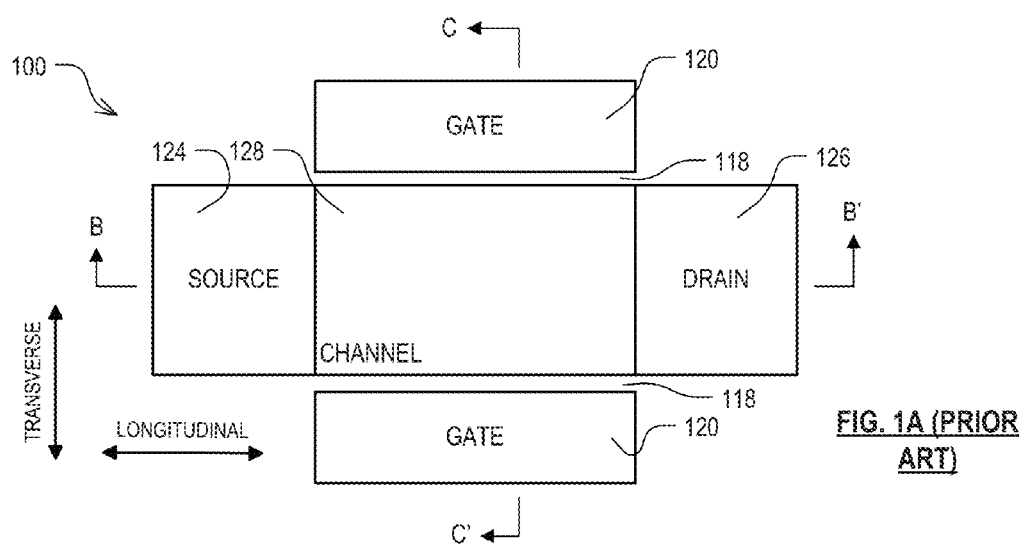
Figure 1B:
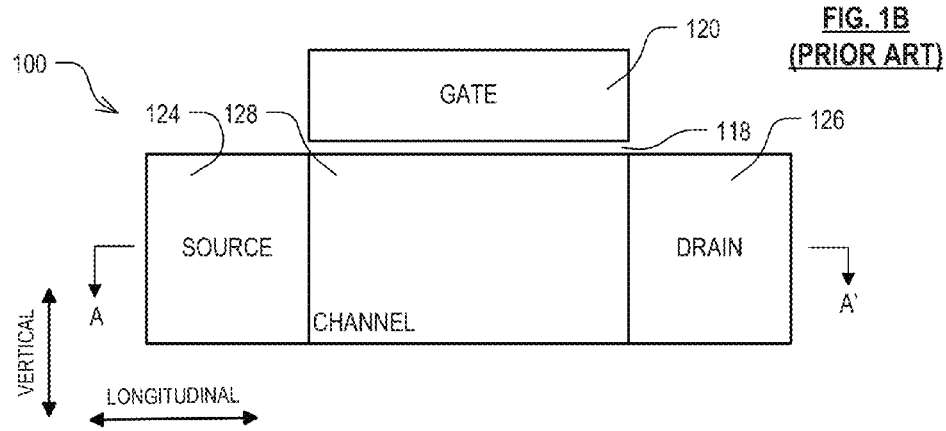
Figure 1D:
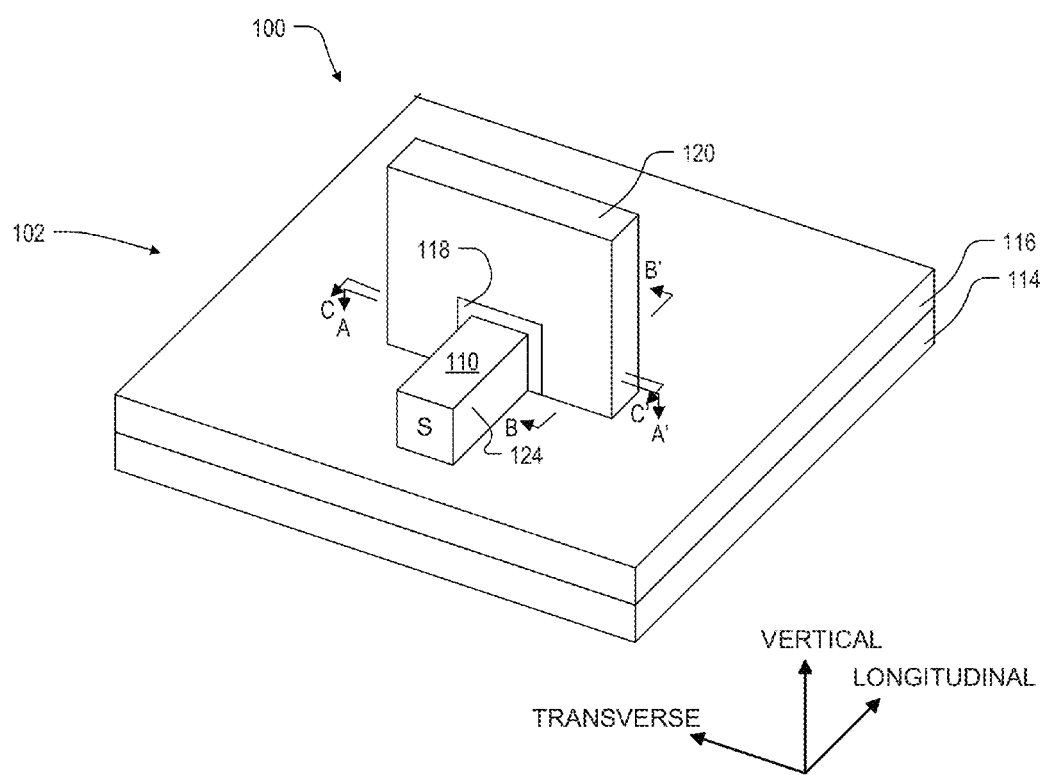

FIG. 1D is a perspective view of a simplified FinFET transistor 100 on an SOI wafer 102. As with all mechanical drawings herein, FIG. 1D is not drawn to scale. A bulk silicon substrate 114 underlies a buried oxide layer 116, and an undoped silicon layer above them has been patterned with a fin (body 110) having longitudinally separated source and drain volumes for the transistor 100. In other embodiments, the buried oxide layer 116 can be omitted, or the silicon body 110 can extend down through the oxide layer 116 (which may in such an embodiment be STI) into the bulk silicon substrate 114. In any of these cases the fin 110 can be said to extend vertically from the wafer surface.

In the drawing, only the source volume 124 is visible, the drain region being hidden behind the gate structures. Also, while FIG. 1D shows only one fin 110, typically a number of fins are formed in parallel and connected together at their respective ends to common source and drain landing pads, respectively. For clarity of illustration, though only one fin is shown in FIG. 1D. In addition, while the body 110 in FIG. 1D is entirely undoped silicon, as used herein, the term "body" does not necessarily require that the structure be all of a single material. Nor does it need to be physically separate from an adjacent body of a different material.

A gate dielectric layer 118 overlies and wraps around the silicon body 110. The gate dielectric 118 may be a single material or a composite of more than one material, all of which are collectively referred to herein as the gate dielectric. A gate conductor 120, which can be implemented using metal or polysilicon for example, overlies and wraps around the gate dielectric 118. As with the gate dielectric 118, the gate conductor 120 can be implemented using a single material or a composite of more than one material, all of which are collectively referred to herein as the gate conductor 120. The combination of gate dielectric 118 and gate conductor 120 is sometimes referred to herein as a gate stack, there being no implication herein that a stack must necessarily be vertical. FIG. 1D also indicates directions of the device referred to herein as longitudinal, transverse and vertical. (The transverse direction also is sometimes referred to herein as the lateral direction.) In a FinFET on which the gate conductor wraps two or more sides of the fin, as in FIG. 1D, the portions of the gate conductor which face different sides of the fin are sometimes referred to herein as different "gates". However, they are also sometimes referred to herein as a single gate or gate conductor.

FIG. 1C is a cross-sectional view of the transistor 100, taken along site lines C-C' of FIG. 1D. The wafer 102 is omitted from FIG. 1C for clarity of illustration. FIG. 1C also indicates the transverse and vertical directions of the device.

FIG. 1A is a top view of the transistor 100, taken along sight lines A-A' of both FIGS. 1D and 1C. The view of FIG. 1C is taken along sight lines C-C' of FIG. 1A. FIG. 1A also indicates the transverse direction of the device, as well as the longitudinal direction. It can be seen that the fin 110 comprises doped volumes 124 and 126 on longitudinally opposite ends of a channel volume 128. The volumes 124 and 126 act as source and drain volumes of the transistor, though typically the choice of which is the source and which is the drain depends on how they are connected in a circuit. These volumes are therefore sometimes referred to herein generically as source/drain volumes. The source/drain volumes 124 and 126 are doped for the same conductivity type (N or P). The channel volume may be undoped silicon, for example, or may be doped to exhibit the conductivity type opposite that of the source/drain volumes. The two sides (but not the top) of the gate conductor 120 also can be seen in FIG. 1A, separated from the channel volume 128 by gate dielectric 118.

FIG. 1B is a side view of the transistor 100, taken along sight lines B-B' of both FIGS. 1D and 1A. The view of FIG. 1A is taken along sight lines A-A' of FIG. 1B. FIG. 1B also indicates the longitudinal and vertical directions of the device. The channel volume 128 of fin 110, as well as the two source/drain regions 124 and 126 can be seen in FIG. 1B. The top part of gate conductor 120 also can be seen in FIG. 1B, separated from the channel volume 128 by gate dielectric 118. FIGS. 1D, 1C, 1A and 1B are sometimes referred to collectively herein as FIG. 1.

Figure 2A:
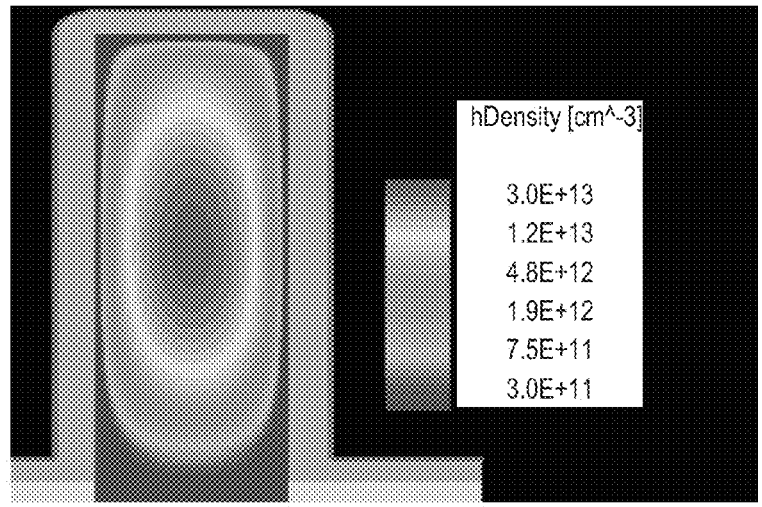
FIGS. 2A, 2B and 2C are sometimes referred to collectively as FIG. 2.

FIG. 2A is a cross-sectional view of the channel volume 128, illustrating by simulation the cross-sectional distribution of current densities in the fin at a particular longitudinal position while the transistor is in the off-state. As used herein, the "off-state" of a transistor is a state of the transistor in which the gate-source voltage is zero and the drain-source voltage is at the power supply voltage Vdd. In these drawings, current density is indicated by color, with colors toward the blue end of the spectrum indicating lower current densities and colors toward the red end of the spectrum indicating higher current densities. It can be seen that leakage currents flow through the channel, and current flow is strongest in the cross-sectional center of the fin where the influence of gate voltage is weakest.

Figure 2B:
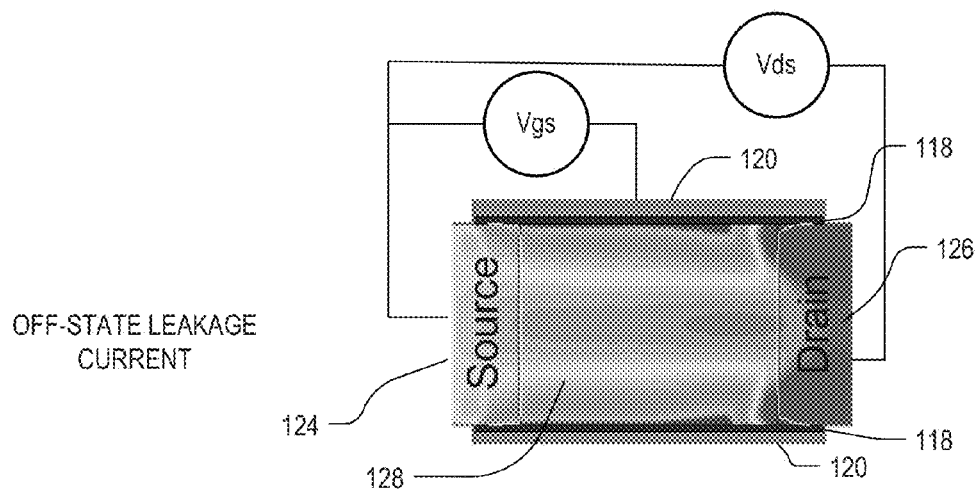

FIG. 2B is a top view of the transistor of FIG. 1A, taken from a horizontal 2D slice through the middle of the fin height, and illustrating by simulation the longitudinal and transverse distribution of current densities in the fin while the transistor is in the off-state. As in FIG. 2A, current density is indicated by color, with colors toward the blue end of the spectrum indicating lower current densities and colors toward the red end of the spectrum indicating higher current densities. It can be seen that leakage currents flow with greatest density in roughly the center of the fin transversely. Again it is noted that this is where the influence of gate voltage is weakest. FIG. 2B also shows the application of voltage biases $V_{DS}$ and $V_{GS}$ to the transistor.

Figure 3C:
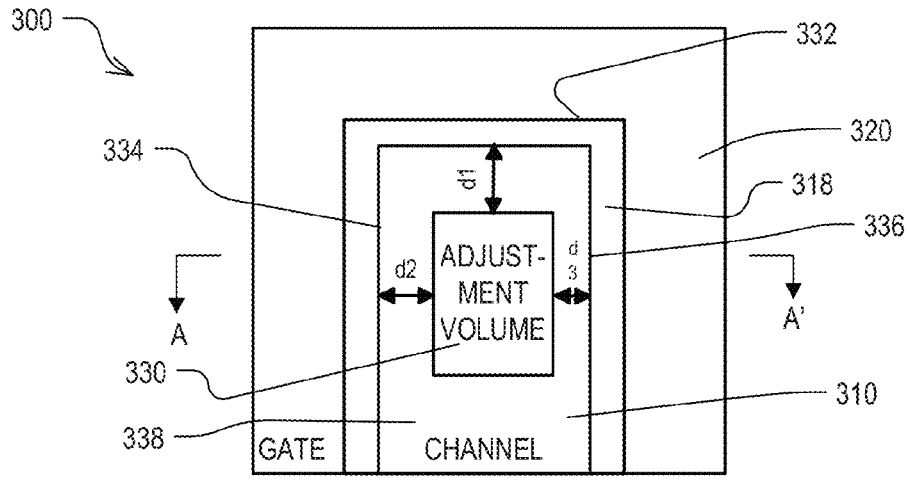
FIGS. 3C, 3A and 3B (collectively FIG. 3) illustrate a simplified FinFET transistor 300, incorporating aspects of the invention.
Figure 3A:
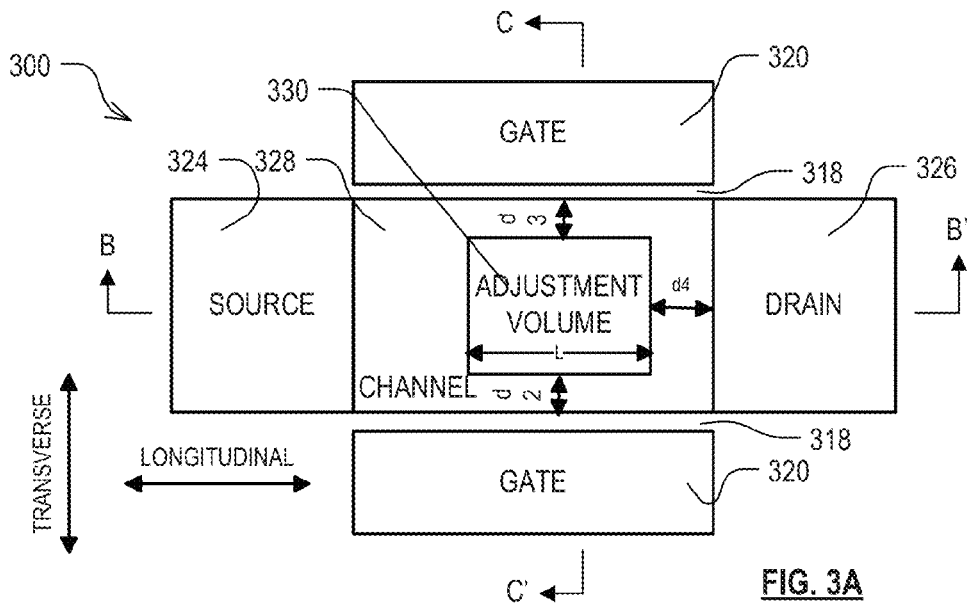
Figure 3B:
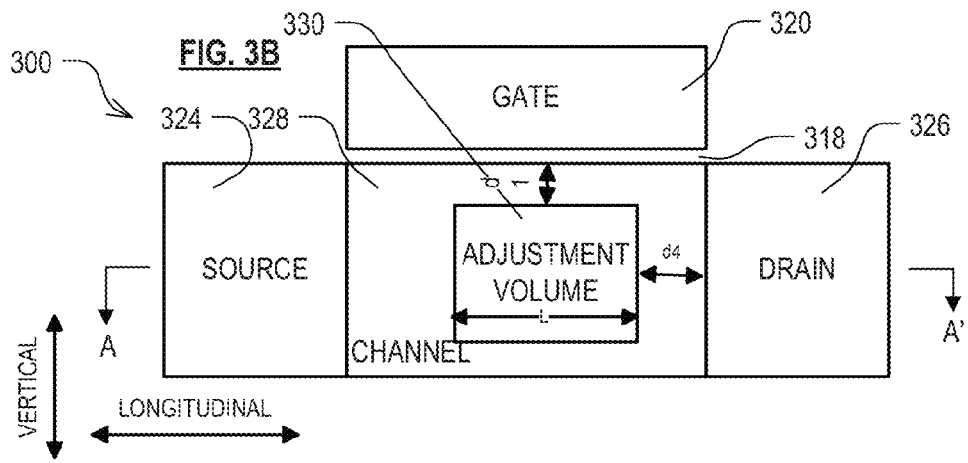

FIGS. 3C, 3A and 3B (collectively FIG. 3) illustrate a simplified FinFET transistor 300, incorporating aspects of the invention, on an SOI wafer (not shown). FIG. 3C is a cross-sectional view of transistor 300 corresponding to the view of transistor 100 in FIG. 1C; FIG. 3A is a top view of transistor 300 corresponding to the view of transistor 100 in FIG. 1A; and FIG. 3B is a side view of transistor 300 corresponding to the view of transistor 100 in FIG. 1B. In FIG. 3, an undoped silicon fin (body 310) has longitudinally separated source and drain volumes 324 and 326 for the transistor 300. A channel region 328 separates the source and drain volumes 324 and 326 longitudinally. A gate dielectric 318 overlies and wraps around the silicon body 310, and a gate conductor 320 overlies and wraps around the gate dielectric 318. Thus the gate dielectric 318 is disposed between the gate conductor 320 and the channel volume 328. Other aspects and variations for the elements of transistor 300 are the same as those set forth above for transistor 100.

Transistor 300 differs from transistor 100, however, in that the fin 310 includes within its channel volume an adjustment volume 330. The adjustment volume 330 has a different electrical conductivity from the surrounding material in the fin 310, at least while the transistor 300 is in the off-state. Preferably, at least while the transistor 300 is in the off-state, the material in the adjustment volume at each longitudinal position has an electrical conductivity which differs from that of the adjacent body material at the same longitudinal position. As seen best in FIG. 3C, the cross-section of adjustment volume 330 is spaced behind the surfaces on each side of the fin 310 over which the gate conductor 320 is formed. Thus the adjustment volume 330 is spaced below a top surface 332 by a distance d1, spaced to the right of left surface 334 by a distance d2, and spaced to the left of right surface 336 by a distance d3. The adjustment volume 330 in FIG. 3 is also shown spaced from the bottom surface 338 of the structure, where no gate conductor is present, but this is not necessary in all embodiments. As used herein, "surfaces" need not be planar, though typically they are continuous. Also as used herein, a position "behind" a surface of a body is a position inside the body. The term does not depend on device orientation, so if viewed from above for example, "behind" a surface means "below" the surface. Still further, whereas the left and right surfaces 334 and 336 are sometimes referred to herein as "laterally opposite" or "laterally opposing" each other, it will be appreciated that surfaces with that description are not required to be vertical. They may be diagonal, for example, such as in FIG. 7.

In one embodiment, the adjustment volume has less conductivity than the surrounding fin volume in the off-state. Preferably the adjustment volume is a dielectric, or an air gap. The distances d1, d2 and d3 are chosen to be small enough that the adjustment volume blocks most leakage current flow through the weakly controlled cross-sectional center of the fin 310 when the transistor 300 is in the off-state, while still allowing plenty of current flow around the adjustment volume when the transistor 300 is in the on-state. The exact sizes of distances d1, d2 and d3 will depend on the particular application.

Figure 4:
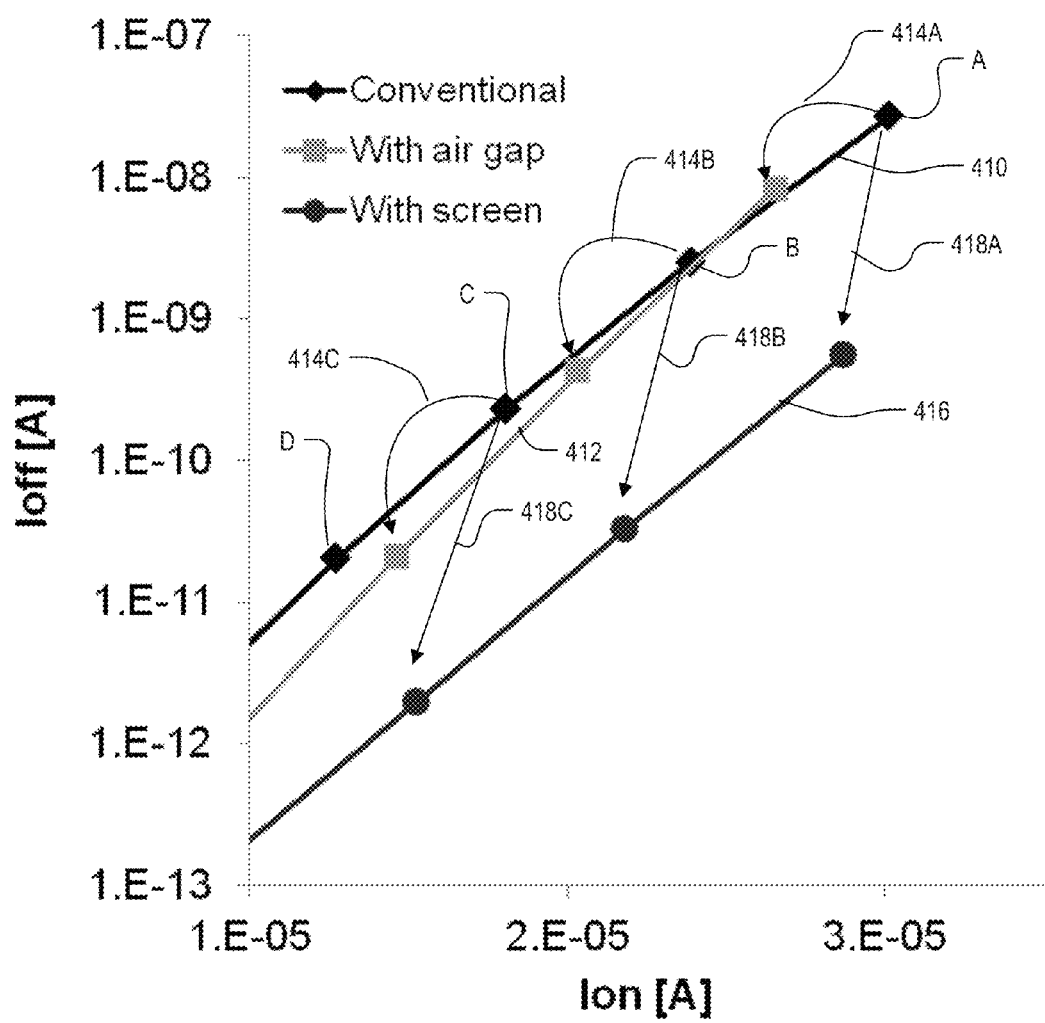
FIG. 4 is a plot illustrating by simulation how Ion and Ioff change with the introduction of the adjustment volume of FIG. 3, for a number of different example configurations.

FIG. 4 is a plot illustrating by simulation how Ion and Ioff change with the introduction of adjustment volume 330, for a number of different example configurations. Line 410 plots values for Ion and Ioff for an example conventional FinFET having no adjustment volume, for four different gate work functions A, B, C and D. A transistor with gate work function A or B would likely be targeted for high performance applications, since they achieve higher Ion at the expense of higher Ioff. A transistor with gate work function C or D would likely be targeted for low power applications, since they achieve lower Ioff at the expense of lower Ion. It can be seen that for gate work function A, Ion is about $3\times10^{-5}$ A and Ioff is about $2.5\times10^{-8}$ A, for an Ion/Ioff ratio of about 1200. For gate work function B, Ion is about $2.4\times10^{-5}$ A and Ioff is about $2.5\times10^{-9}$ A, for an Ion/Ioff ratio of about 9,600. For gate work function C, Ion is about $1.8\times10^{-5}$ A and Ioff is about $2\times10^{-10}$ A, for an Ion/Ioff ratio of about 90,000. It is desirable to shift this curve to the right and/or downward, which would indicate either a gain in Ion at a fixed Ioff or a drop in Ioff at a fixed Ion or a combination of both.

Line 412 plots values for Ion and Ioff for the same example FinFET, but with an air gap adjustment volume inserted, for the gate work functions A, B and C. Arrows 414A, 414B and 414C (collectively 414) indicate how the Ion and Ioff values have changed for the three gate work functions A, B and C. It can be seen that while in all three cases both Ion and Ioff have been reduced, the curve 412 remains roughly consistent with curve 410. Nevertheless, a small improvement is shown for chips targeted for low-power applications.

While an air gap adjustment volume provides some benefit for low power chips, it would be desirable to provide additional benefit for a wide range of applications.

Figure 5A:
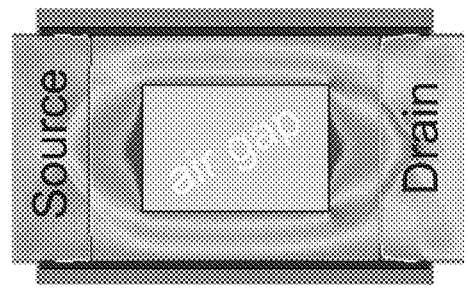
FIGS. 5A and 5B, sometimes referred to collectively herein as FIG. 5, are top views of the transistor 300, taken from a horizontal 2D slice through the middle of the fin height, and in which the adjustment volume of FIG. 3 is an air gap.

FIG. 5A is a top view of the transistor 300, taken from a horizontal 2D slice through the middle of the fin height, and in which the adjustment volume 330 is an air gap. The drawing illustrates by simulation the longitudinal and transverse distribution of current densities in the fin while the transistor is in the off-state. As in FIG. 2A, current density is indicated by color, with colors toward the blue end of the spectrum indicating lower current densities and colors toward the red end of the spectrum indicating higher current densities. It can be seen that while leakage currents have been blocked through the air gap in the cross-sectional center of the fin 310, they continue to flow round the outer regions of the fin. The density of the leakage current is smaller than in the transistor 100 (compare to FIG. 2B), but the current density in the on-state can be expected to be smaller as well due to the reduced cross-sectional area through which current can flow.

Returning to FIG. 4, line 416 plots values for Ion and Ioff for the same example FinFET 300, for the gate work functions A, B and C, but this time with an electrically conductive screen material in the adjustment volume. The screen material can be for example a metal, or a heavily doped semiconductor. Arrows 418A, 418B and 418C (collectively 418) indicate how the Ion and Ioff values have changed for the three gate work functions A, B and C. It can be seen that in all three cases, while Ion reduces, Ioff reduces substantially. The curve 416 is therefore shifted markedly downward. In the examples illustrated, the conductive screen can increase Ion by 50% at a fixed Ioff of $10^{-10}$ A. Alternatively, it can increase switching speed by an amount on the order of 25%, or reduce leakage current by a factor on the order of 40, or a combination of both.

Figure 6A:
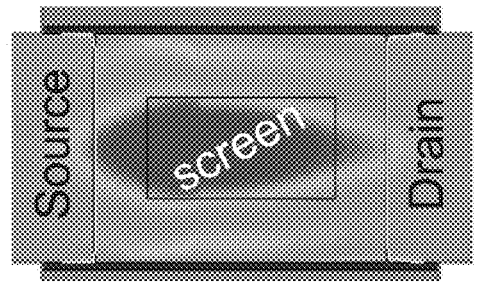
FIGS. 6A and 6B, sometimes referred to collectively herein as FIG. 6, are top views of the transistor 300, taken from a horizontal 2D slice through the middle of the fin height, and in which the adjustment volume of FIG. 3 is a conductive screen material.

FIG. 6A is a top view of the transistor 300, taken from a horizontal 2D slice through the middle of the fin height, and in which the adjustment volume 330 is an electrically conductive material. As with FIG. 5A, FIG. 6A illustrates by simulation the longitudinal and transverse distribution of current densities in the fin while the transistor is in the off-state. Current density is indicated by color, with colors toward the blue end of the spectrum indicating lower current densities and colors toward the red end of the spectrum indicating higher current densities. It can be seen that while small leakage currents continue to flow round the outer regions of the fin, they have been effectively blocked through the conductive screen in the cross-sectional center of the fin 310.

Figure 2C:
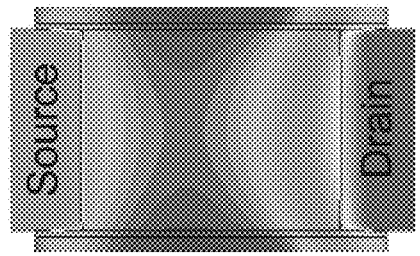

It is believed that whereas the air gap of the FIG. 5A embodiment operates by physically blocking current flow through the center of the fin, the conductive screen of FIG. 6A operates instead by terminating the off-state electrostatic drain potential field. FIG. 2C is a top view of the transistor 300, taken from a horizontal 2D slice through the middle of the fin height, and with no material difference in the adjustment volume 330. Thus the structure is the same as that of FIG. 2B. Whereas FIG. 2B illustrates current density, FIG. 2C illustrates by simulation the longitudinal and transverse distribution of electrostatic potential in the fin while the transistor is in the off-state. Potential is indicated by color, with colors toward the blue end of the spectrum indicating lower values (lower magnitude potentials) and colors toward the red end of the spectrum indicating higher values (higher magnitude potentials). It can be seen that in the conventional FinFET, the drain field penetrates through the channel and lowers the source junction barrier. This effect is known as drain-induced barrier lowering (DIBL), and contributes to the leakage current seen in FIG. 2B.

Figure 5B:
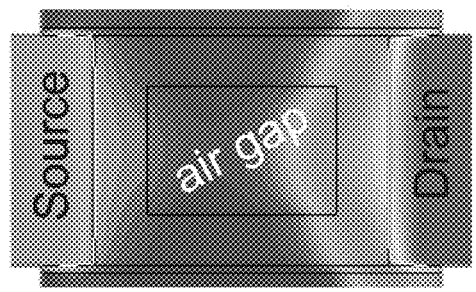

FIG. 5B is a top view of the transistor 300, taken from a horizontal 2D slice through the middle of the fin height, and in which the adjustment volume 330 is an air gap. The structure corresponds to that of FIG. 5A. Using the same color scale as in FIG. 2C, FIG. 5B illustrates by simulation the longitudinal and transverse distribution of electrostatic potential in the fin while the transistor is in the off-state. It can be seen that in a FinFET with a dielectric material in the adjustment volume, the drain field penetrates into the adjustment volume and fails to significantly affect DIBL. This would explain why significant leakage current continues to flow as illustrated in FIG. 5A.

Figure 6B:
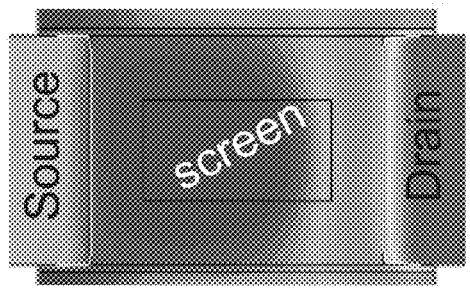

FIG. 6B is a top view of the transistor 300, taken from a horizontal 2D slice through the middle of the fin height, and in which the adjustment volume 330 is an electrical conductor. The structure corresponds to that of FIG. 6A. Using the same color scale as in FIG. 2C, FIG. 6B illustrates by simulation the longitudinal and transverse distribution of electrostatic potential in the fin while the transistor is in the off-state. It can be seen that in a FinFET with a conductive material in the adjustment volume, the drain potential sharply reduces in magnitude at the drain-side vertical surface of the adjustment volume. DIBL is thus greatly reduced, explaining why leakage current is so greatly reduced as illustrated in FIG. 6A. In addition, it can be appreciated that in the on-state, current flow is not significantly reduced because current flows through electrical conductors.

Design Considerations

Aspects of the invention involve a different or modified material in an adjustment volume within the channel volume of a transistor. In an embodiment like that of FIG. 5A, the adjustment volume material can be air or a dielectric, in which case it can provide the benefits described above and illustrated in FIG. 4, line 412, primarily but not exclusively for low power devices. While these benefits appear to be maximized for adjustment volume materials which have very low conductivity (at least in the off-state), it is believed that some benefits can be achieved for adjustment volume materials whose conductivity in the off-state is to any degree smaller than that of the surrounding fin material. Other example materials with lower conductivity that can be used include typical dielectrics like silicon dioxide, or low-k dielectrics, or high-k dielectrics, or a semiconductor with wider bandgap that has an appropriate conduction band offset for the NMOSFETs or appropriate valence band offset for the PMOSFETs such that the carriers are pushed away from the adjustment volume towards the gate.

Alternatively, in an embodiment like that of FIG. 6A, the adjustment volume material can be an electrical conductor, in which case it can provide the benefits described above and illustrated in FIG. 4, line 416. While these benefits appear to be maximized for adjustment volume materials which have very high conductivity (at least in the off-state), it is believed that some benefits can be achieved for adjustment volume materials whose conductivity in the off-state is to any degree higher than that of the surrounding fin material. Example materials with higher conductivity that can be used include metals such as cobalt, silver or aluminum, although these may be limited to use in low temperature processes in order to avoid reacting or intermixing with the surrounding silicon. Other materials include nitrides such as titanium nitride or tantalum nitride. Another material that can be used is simply a heavily doped portion of the fin.

FIG. 3C, described above, illustrates a cross-sectional position within a fin at which the adjustment volume may be located. The illustration is for a fin with a rectangular cross-section, an adjustment volume which is an idealized rectangular parallelepiped, and a gate conductor 320 which wraps around three sides of the fin. In this case the three distances d1, d2 and d3 are easily defined as illustrated in the drawing.

At least in an embodiment in which the adjustment volume material is more conductive in the off-state than the surrounding fin material, these distances preferably should be small enough to terminate or block most of the drain field when the transistor is in the off-state, but large enough to permit good conductivity in the channel when the transistor is in the on-state. Good on-state conductivity limits the minimum distances because of effects such as quantum separation and carrier scattering in very thin channels. As an example, the distances d1, d2 and d3 may each be on the order of 3 nm.

FIGS. 3A and 3B also show a distance d4, which is the longitudinal distance by which the drain-side surface of the adjustment volume is set back from the drain volume 326. Distance d4 should be large enough to electrically separate the adjustment volume from the source and from the drain. If it is too large, then the adjustment volume would be so small that it is difficult to manufacture. So, for practical considerations, distance d4 should be several nanometers, in the range from 1 nm to 5 nm.

FIGS. 3A and 3B also show a length L, which is the length in the longitudinal direction of the adjustment volume 326. Length L should be long enough to terminate the drain field effectively. As an example, length L should be at least about 2 nm. It can also be much longer, which may simplify fabrication.

Note that the three distances d1, d2 and d3 need not be equal to each other in all embodiments. Note also that in a particular embodiment, the gate may not wrap around all three sides of the fin as shown in FIG. 3C. As used herein, the gate is said to "face" a given side of the fin if it generally parallels the given side, is separated from the given side with a dielectric material in between, and influences the conductivity of the fin material depending on whether an on-state or off-state voltage is applied to the gate conductor. In some embodiments the gate may face only two sides of the fin, or in some embodiments, such as an ETSOI, the gate faces only on side of the "fin" (i.e. the top surface of the channel region). In these cases the same considerations as set forth above with respect to distances d1, d2 and d3 would continue to apply, but only for the sides of the fin which face a portion of the gate conductor. In some embodiments one or more of the distances, to a side of the fin which lacks a facing gate conductor, may even be zero.

The various distances d1, d2, d3 and also d4 can be chosen in dependence upon the goals of the particular design. Referring to the plot of FIG. 4, it will be appreciated that line 412 or 416 (as the case may be) will move to different positions in dependence on such distances, as well as in dependence upon transistor size, cross-sectional fin shape, and all the materials involved. In all situations an optimum set of distances can be found which best achieve the particular design goals, optionally with consideration of manufacturing expedience.

Figure 7:
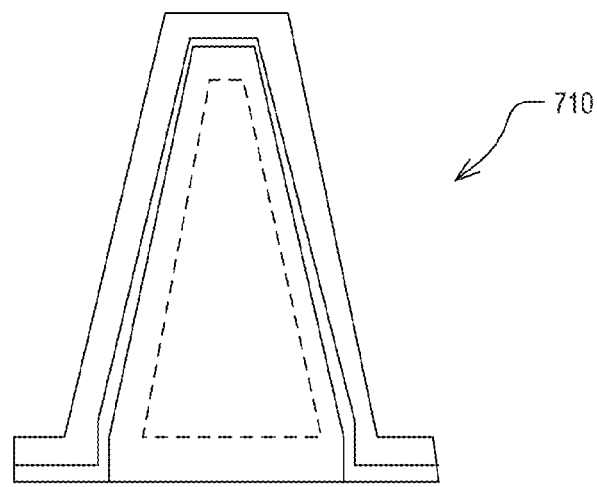
FIGS. 7 and 8 illustrate alternative fin shapes.
Figure 8:
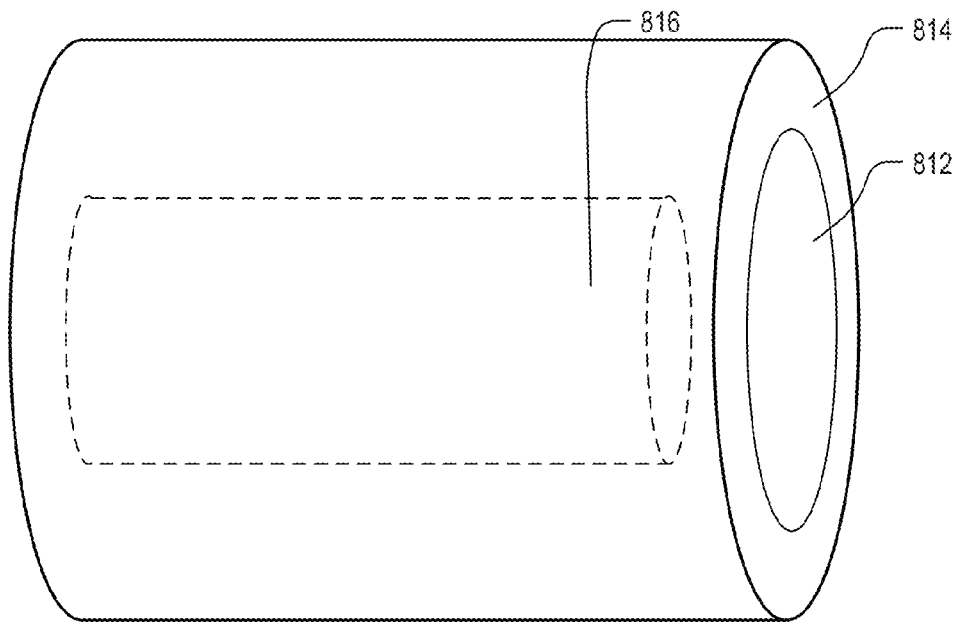

Also, note that whereas the illustration of FIG. 3C is for a fin with a rectangular cross-section, an adjustment volume which is an idealized rectangular parallelepiped, and a gate conductor 320 which wraps around three sides of the fin, none of those features need necessarily obtain in different embodiments. FIG. 7, for example, illustrates a fin 710 having a triangular cross-section. An adjustment volume 712 is shown with dotted outlines. FIG. 8 illustrates a nano-wire 810 in which the fin 812 is cylindrical and is wrapped on all sides cross-sectionally by a gate stack 814. An adjustment volume 816 is shown with dotted outlines. These structures, as well as many others, can also benefit from the use of an adjustment volume of different off-state conductivity than the surrounding fin material as described herein. In all cases the distance by which the adjustment volume is set back behind a surface of the fin will depend on the particular structure, and both those distances and the adjustment material conductivity can be optimized for desired improvement in switching speed, leakage current, and/or Ion/Ioff. In general, the use of such an adjustment volume enables significant improvement in these quantities, while retaining larger fin widths as needed for manufacturability In addition, the adjustment volume material can be chosen also to introduce desired stresses for stress engineering purposes. In general, for semiconductors, electrons benefit from longitudinal tensile stress whereas holes benefit from longitudinal compressive stress. Typically the adjustment volume mainly induces longitudinal stress. Therefore for an N-channel transistor, where the adjustment volume material is crystalline, its crystal type should be the same as the channel crystal type but it should have a lattice size which is somewhat larger than the channel material. For example, the fin material in the channel may be silicon and the adjustment volume material may be SiGe. This will introduce longitudinal tensile stress into the surrounding body material in the channel. Conversely, for a P-channel transistor, where the adjustment volume material is crystalline, its crystal type should be the same as the channel crystal type but it should have a lattice size which is somewhat smaller than the channel material. For example, the fin material in the channel may be SiGe and the adjustment volume material may be silicon. This will introduce longitudinal compressive stress into the surrounding body material in the channel. Other materials and variations will be apparent to the reader.

Fabrication Method

FIGS. 9A-9I (collectively FIG. 9) illustrate a sequence of steps by which a desired adjustment volume material can be formed inside a fin as illustrated in FIG. 3. It is to be understood and appreciated that the process steps and structures described herein do not describe a complete process flow for the manufacture of an integrated circuit. The invention may be practiced in conjunction with various integrated circuit fabrication techniques that are conventionally used in the art, or that are hereafter developed, and only so much of the commonly practiced process steps are included herein as are necessary to provide an understanding of the invention.

Each FIG. 9A-9I shows three views: end, top and side, corresponding to the same three views shown in FIGS. 3C, 3A and 3B, respectively. The fin material in the embodiment of FIG. 9 is silicon, though in other embodiments it can be other types of semiconductor such as but not limited to germanium (Ge), a silicon germanium alloy ($Si_xGe_y$), gallium arsenide (GaAs), InSb, GaP, GaSb, as well as carbon nanotubes. Also in the embodiment of FIG. 9 the fin is an intrinsic (i.e., undoped) silicon film. In other embodiments, the fin is doped to a p type or n type conductivity with a concentration level between $10^{16}$-$10^{19}$ atoms/cm³. Also in the embodiment of FIG. 9, the adjustment volume material is heavily doped silicon.

In FIG. 9A, a silicon fin 910 is formed on an SOI wafer (not shown). The top view of FIG. 9A shows sight lines E-E' showing where the end view is taken, and sight lines S-S' showing where the side view is taken. The side view shows sight lines T-T' showing where the top view is taken. The sight lines are omitted from many of the subsequent drawings for clarity of illustrations. The silicon fin 910 can be formed by any method, such as by deposition of silicon followed by lithographic etching. The fin 910 extends vertically from the wafer to a height above the wafer surface roughly equal to the desired height of the fin. For example, the height of fin 910 may be 30 nm.

In FIG. 9B, a sacrificial gate stack 912 is formed on all three exposed sides if the silicon fin 910. Typically sacrificial gate stack 912 includes a thin gate dielectric such as an oxide wrapping the fin, and a gate conductor such as polysilicon formed thereon, again on all three sides. Layer 912 is referred to as being sacrificial because, consistently with some conventional processes, downstream it will be removed and replaced with other materials. In this sense layer 912 acts merely as a placeholder.

In FIG. 9C, the wafer is coated with an oxide 914, and then etched back to expose the top surface of the sacrificial layer 912. Since the top surface of the layer 912 is higher than the height of the silicon fin 910, the longitudinal portions of the fin which will become the source/drain regions 918 remain covered by a layer of oxide 914. In FIG. 9D the sacrificial layer 912 is removed, for example by selective etching. This step exposes the silicon fin 910 top surface, and also opens holes 916 on the two laterally facing sides of the fin. The fin 910 is now exposed on all three sides (top and the two laterally facing sides), but only within the longitudinal extent of the channel region.

In FIG. 9E, silicon nitride is deposited over the entire wafer and then anisotropically etched back to again expose the top surface of the fin 910. SiN sidewall spacers 920 remain on all the vertical surfaces in the structure, including all the inside sidewalls of the oxide 914 and the two laterally facing sides of the fin 910. Importantly, this includes the sidewalls 920A and 920B of the oxide 914 which are disposed at the two longitudinally opposite ends of the channel volume of the fin 910. The spacers may have a thickness on the order of _ nm.

Next, also as shown in FIG. 9E, a dopant such as B or As is implanted or diffused into the exposed portion of the silicon to a sufficiently heavy concentration to render the silicon electrically conductive within the doped volume. The dopant type should be the opposite to the dopants in the source and drain. For example, the dopant may be arsenic for the PMOSFET, and the concentration within the doped volume may be in the range $10^{19}$ cm$^{-3}$ to $10^{21}$ cm$^{-3}$. The heavily doped volume does not extend into the portions of the fin below the SiN spacers 920A and 920B. Also, though in one embodiment the implantation energy is such that the dopant atoms are injected into the fin 910 all the way down to the wafer surface level, that is not always necessary and in the embodiment of FIG. 9 the dopant atoms do not reach so deeply. The heavily doped volume therefore is spaced from the level of the wafer surface by some small distance.

In FIG. 9F, the SiN layer is removed, leaving a heavily doped volume shown in the drawing as dotted region 922. It can be seen that doped volume 922 is spaced from the wafer surface level by an undoped silicon volume 924, and also spaced longitudinally from the source/drain volumes 918 roughly by the thickness of the SiN sidewall spacers. Atop the undoped volume 924, though, the doped volume 922 extends all the way to the top surface and the two laterally facing surfaces of the fin 910.

In FIG. 9G, a new layer 926 of undoped silicon is grown epitaxially on all exposed surfaces of the fin 910. It can be seen that the heavily doped volume 922 is not only spaced from the source/drain volumes 918 as previously mentioned, but is also spaced behind all three surfaces (top and two laterally opposing side surfaces) of the fin. In FIG. 9H the gate stack 928 is formed by conventional means over all exposed surfaces of the fin, including the top and the two laterally opposing side surfaces. In FIG. 9I the oxide 914 is removed by conventional means and processing continues with the remainder of the steps involved in fabricating the integrated circuit chips. This includes doping the source/drain volumes with donor or acceptor dopant atoms in order to make the transistor an N-type or P-type transistor, respectively.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description it will be evident to a person skilled in the art that various modifications may be made within the scope of the invention.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. In particular, and without limitation, any and all variations described, suggested or incorporated by reference in the Background section of this patent application are specifically incorporated by reference into the description herein of embodiments of the invention. In addition, any and all variations described, suggested or incorporated by reference herein with respect to any one embodiment are also to be considered taught with respect to all other embodiments. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. An integrated circuit transistor structure comprising:
    a body of semiconductor material, the body having first and second longitudinally spaced doped source/drain volumes and further having at least a first surface, the body further having a channel volume located longitudinally between the first and second source/drain volumes;
    a gate conductor disposed outside the body, the gate conductor having a first portion facing the first surface and being located longitudinally at least partly along at least part of the channel volume; and
    a dielectric material between the gate conductor and the first surface of the body,
    the body containing an adjustment volume, longitudinally within the channel volume and spaced behind the first surface by a first distance and spaced longitudinally from both the first and second source/drain volumes,
    wherein the adjustment volume comprises an adjustment volume material having, at each longitudinal position, an electrical conductivity which differs from that of the adjacent body material at the same longitudinal position, at least while the transistor is in an off-state.

2. The structure of claim 1, wherein the first surface of the body is a top surface of the body.

3. The structure of claim 2, wherein the body comprises a fin extending vertically from a wafer surface.

4. The structure of claim 1, wherein the body comprises a fin extending vertically from a wafer surface, wherein the first surface is a first side surface of the fin.

5. The structure of claim 4, wherein the dielectric material is disposed further on a second surface of the body being a second side surface of the fin laterally opposite the first side surface,
    wherein the gate conductor includes a second portion disposed facing the second surface and separated from the second surface by the dielectric material,
    and wherein the adjustment volume is further spaced behind the second surface by a second distance.

6. The structure of claim 5, wherein the first and second surfaces are vertical.

7. The structure of claim 5, wherein the dielectric material is disposed further on a third surface of the body being a top surface of the body,
    wherein the gate conductor includes a third portion disposed facing the third surface and separated from the third surface by the dielectric material,
    and wherein the adjustment volume is further spaced behind the third surface by a third distance.

8. The structure of claim 1, wherein the first surface of the body rings the body.

9. The structure of claim 1, wherein electrical conductivity of the adjustment volume material is less than that of the adjacent body material at each of the longitudinal positions while the transistor is in an off-state.

10. The structure of claim 1, wherein the adjustment volume material is a dielectric.

11. The structure of claim 1, wherein the adjustment volume material is air.

12. The structure of claim 1, wherein electrical conductivity of the adjustment volume material is greater than that of the adjacent body material at each of the longitudinal positions while the transistor is in an off-state.

13. The structure of claim 1, wherein the adjustment volume material is a metal.

14. The structure of claim 1, wherein the adjustment volume material is a heavily doped semiconductor.

15. The structure of claim 1, wherein the adjustment volume material introduces mechanical stress into the adjacent body material.

16. The structure of claim 1, wherein the transistor structure forms an N-channel transistor, and wherein the adjustment volume material introduces longitudinal tensile stress into the adjacent body material.

17. The structure of claim 1, wherein the transistor structure forms a P-channel transistor, and wherein the adjustment volume material introduces longitudinal compressive stress into the adjacent body material.

18. An integrated circuit transistor structure comprising:
    a body of semiconductor material, the body having first and second longitudinally spaced doped source/drain volumes and further having at least a first surface, the body further having a channel volume located longitudinally between the first and second source/drain volumes;
    a gate conductor disposed outside the body, the gate conductor having a first portion facing the first surface and being located longitudinally at least partly along at least part of the channel volume; and
    a dielectric material between the gate conductor and the first surface of the body,
    the body containing a dielectric material, longitudinally within the channel volume and spaced behind the first surface by a first distance and spaced longitudinally from both the first and second source/drain volumes.

19. The structure of claim 18, wherein the dielectric material comprises air.

20. An integrated circuit transistor structure comprising:
a body of semiconductor material, the body having first and second longitudinally spaced doped source/drain volumes and further having at least a first surface, the body further having a channel volume located longitudinally between the first and second source/drain volumes;
a gate conductor disposed outside the body, the gate conductor having a first portion facing the first surface and being located longitudinally at least partly along at least part of the channel volume; and
a dielectric material between the gate conductor and the first surface of the body,
the body containing an electrically conductive material, longitudinally within the channel volume and spaced behind the first surface by a first distance and spaced longitudinally from both the first and second source/drain volumes.

21. The structure of claim 20, wherein the conductive material comprises a metal.

22. The structure of claim 20, wherein the conductive material comprises a heavily doped semiconductor.

23. A method for fabricating an integrated circuit transistor structure comprising steps of:
providing a body of semiconductor material, the body having first and second longitudinally spaced doped source/drain volumes and further having at least a first surface, the body further having a channel volume located longitudinally between the first and second source/drain volumes;
forming a gate conductor outside the body, the gate conductor having a first portion facing the first surface and being located longitudinally at least partly along at least part of the channel volume;
forming a dielectric material between the gate conductor and the first surface of the body; and
forming an adjustment volume in the body, the adjustment volume being disposed longitudinally within the channel volume and spaced behind the first surface by a first distance and spaced longitudinally from both the first and second source/drain volumes,
wherein the adjustment volume comprises an adjustment volume material having, at each longitudinal position, an electrical conductivity which differs from that of the adjacent body material at the same longitudinal position, at least while the transistor is in an off-state.

24. The method of claim 23, wherein the adjustment volume material comprises a dielectric.

25. The method of claim 23, wherein the adjustment volume material comprises an electrical conductor.

* * * * *